United States Patent [19]
Fisher

[11] Patent Number: 4,879,258
[45] Date of Patent: Nov. 7, 1989

[54] INTEGRATED CIRCUIT PLANARIZATION BY MECHANICAL POLISHING

[75] Inventor: Wayne G. Fisher, Allen, Tex.

[73] Assignee: Texas Instruments Incorporated, Dallas, Tex.

[21] Appl. No.: 238,954

[22] Filed: Aug. 31, 1988

[51] Int. Cl.⁴ .................. H01L 21/304; H01L 21/306
[52] U.S. Cl. ...................... 437/225; 437/974; 437/946; 156/626; 156/636; 156/645; 51/131.1
[58] Field of Search ............. 51/134.5 R, 165, 131.1; 437/225, 974, 946; 148/DIG. 135; 156/636, 626, 627

[56] References Cited

U.S. PATENT DOCUMENTS

| | | | |
|---|---|---|---|
| 3,979,239 | 7/1976 | Walsh | 437/225 |
| 4,144,099 | 3/1979 | Edmonds et al. | 437/225 |
| 4,197,676 | 4/1980 | Sauerland | 51/165 |
| 4,244,775 | 1/1981 | D'Asaro | 156/636 |
| 4,358,338 | 11/1982 | Downey et al. | 156/627 |
| 4,403,453 | 9/1983 | Cave et al. | 51/131.1 |
| 4,419,848 | 12/1983 | Dischert | 51/131.1 |
| 4,462,860 | 7/1984 | Szmanda | 156/626 |
| 4,600,469 | 7/1986 | Fusco et al. | 156/636 |
| 4,671,851 | 6/1987 | Beyer et al. | 156/636 |
| 4,789,648 | 12/1988 | Chow et al. | 437/225 |
| 4,793,895 | 12/1988 | Kaanta et al. | 156/627 |

FOREIGN PATENT DOCUMENTS

| | | | |
|---|---|---|---|
| 0223920 | 6/1987 | European Pat. Off. | 156/636 |
| 0068493 | 6/1978 | Japan | 156/636 |
| 0140632 | 11/1981 | Japan | 437/225 |
| 0170538 | 10/1982 | Japan | 437/225 |

Primary Examiner—Brian E. Hearn
Assistant Examiner—Tuan Nguyen
Attorney, Agent, or Firm—Douglas A. Sorensen; Rodney M. Anderson; Melvin Sharp

[57] ABSTRACT

A process for planarizing the surface of a semiconductor wafer, after the wafer has been processed to form nonplanar topography layers on the blank, polished wafer, by mechanically removing material from this surface by abrasion until a desired planarity is attained. The mechanical planarization prevents step coverage problems encountered in further processing, avoids multiple step prior art planarizing methods, and can be effectively controlled by several simple methods.

7 Claims, 1 Drawing Sheet

4,879,258

INTEGRATED CIRCUIT PLANARIZATION BY MECHANICAL POLISHING

SUBJECT OF THE INVENTION

The invention is a planarization process for semiconductor wafers after processing steps which produce nonplanar surface topography such as in multilevel metallization of VLSI devices.

BACKGROUND OF THE INVENTION

Integrated circuit fabrication processes and techniques commonly would produce unacceptable nonplanar surface topography on the devices produced if planarizing steps were not taken at various stages of the processing. Of course, each additional layer of processing which is itself nonplanar can add to the irregularities of the finally produced device surface. Such irregularities are commonly called steps where an applied film is required to cover two or more levels of a surface. Such steps commonly cause problems in the devices produced because the film is typically thinned in the area of the step. Depending on the material of the film, the conductivity or insulating properties of the film are degraded in the area of the step. During heat, current, or mechanical stress of these steps, the films have been known to break or become discontinuous at the step causing the device to fail. If the step is too large, if the material applied to the step is not sufficiently conformal, or if a combination of these factors occurs, the film may not be continuous over the step or voids may form between two film layers. Also, a problem with fabrication of devices having nonplanar surface features is the fact that the depth of field of known photolithographic steppers becomes very small as feature size becomes less than 1 micron. Therefore, precise focus on such nonplanar surfaces becomes impossible. Devices produced by multilevel metallization techniques wherein two or more layers of patterned metal film crisscross a device to provide lead lines, such as bit lines and word lines of semiconductor memory devices, are typical of the type of device in which planarization steps are desirable during device fabrication.

Several methods in the prior art have been devised to planarize a nonplanar surface of semiconductor devices. For example, a liquid or easily planarized material may be applied to such a surface. A photoresist material is commonly used. The photoresist may be spun on the surface. The photoresist or other material must have the additional property that it has the same or similar etch selectivity as the underlying material of the nonplanar surface with respect to a specific etchant. Then the photoresist planar-surfaced layer is removed completely by this etchant and the nonplanar topography of the underlying layer is also etched to leave a planar surface on the underlying layer. It is commonly necessary then to add to the underlying layer that has been partially removed to insure the required electrical properties of this layer are maintained. This planarization method is detailed in U.S. Pat. No. 4,795,722, issued 1-3-89, to M. Torreno, et al (Ser. No. 010,937), and incorporated herein by reference. This method is not entirely satisfactory in all processes because it adds extra processing steps, depends on the etching properties of the materials, requires an easily planarized material that is sacrificed during the process, and requires careful timing of the etch step.

Other planarization methods are known in the art. For example, furnace or laser reflow is used to reduce the step coverage problems. These methods do not generally produce a truly planar surface, however, and the heat required is sometimes damaging to the device. Also, the dielectric layer required on the device may be spun on to produce a planar surface. However, most dielectrics commonly used cannot be easily spun on to a device. The layer may also be deposited by bias sputtering. However, this method is not always available for all devices and processes and is not capable of producing a good dielectric layer in all cases.

It is also known to polish a blank semiconductor substrate by strictly mechanical means and combined chemical-mechanical means prior to any other processing to remove surface defects and impurities and to produce the very high tolerance flatness and smoothness necessary for critical photolithographic steps and other steps in integrated circuit processing. Several methods and apparatuses are known in the art to accomplish this polishing of single crystal silicon wafers or other semiconductor wafers. Basically mechanical polishing is accomplished by frictional application of a slightly abrasive surface to the surface of the wafer. For example, a circular flat disc can be rotated steadily while a wafer, or more than one wafer, is held by steady and precise pressure stationary against the disc. The disc may be abrasive, in which case it is common to apply deionized water at the interface to carry away particles and reduce heat build up. Also, an abrasive slurry may be introduced to the interface. The slurry can contain mechanically abrasive particles, chemically abrasive compounds, or a mixture of both. Another example of such known polishing processes is to hold a wafer in a lathe-like device and rotate the wafer while applying a cutting device, such as a diamond point stylus or an abrasive surface, steadily across the wafer as it turns. In this example, a liquid is also commonly applied in a similar manner as described in the previous example.

Such polishing techniques and apparatuses have been considered to be "dirty" in that they could introduce foreign elements to the wafer such as from the polishing means. As used for polishing, these devices and processes typically were not closely controlled since it was not at all critical at that processing stage how much of the wafer as removed.

SUMMARY OF THE INVENTION

An object of the invention is to planarize a surface of a semiconductor wafer after processing steps have been accomplished which result in a nonplanar surface having significant steps requiring coverage during subsequent processing.

Another object of the invention is to avoid extra processing steps required by some planarizing methods of the prior art.

Also, an object of the invention is to avoid contamination, heat, material performance, and process limitation problems encountered in the prior art planarizing methods.

It is also an object of the invention to apply known mechanical polishing techniques and apparatuses in a novel manner to planarize partially processed integrated circuit wafers in order to avoid step coverage problems in the final integrated circuit.

These objects and others which will become apparent in the detailed description to follow are accomplished by the described invention wherein mechanical polishing techniques previously applied to unprocessed "blank" wafers are applied to partially processed wafers to remove surface configurations which are nonplanar from, for example, a dielectric layer covering a metal lead layer to produce an essentially planar surface. From that point, the wafer is cleaned and subsequent processing providing additional layers may be accomplished.

DETAILED DESCRIPTION OF THE INVENTION

The invention will now be described in detail with reference to the accompanying figures.

Figure 1:
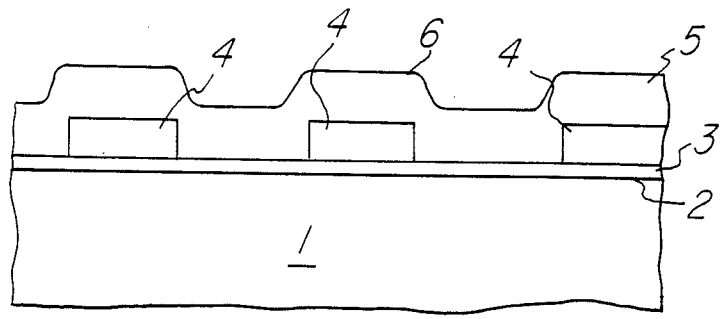
FIG. 1 is a cross sectional representation of a simplified device structure showing a nonplanar surface.

FIG. 1 shows a side view of a simplistic partially processed semiconductor device. Doped regions forming active devices, epitaxial layers, barriers, and field oxide layers, for example, which are well known and which, in various combinations are necessary for such devices are omitted for clarity. In FIG. 1, substrate 1, of single crystal silicon, for example, is a section of a wafer having at least an upper surface 2 which is polished and cleaned to provide a smooth planar surface. Typically, then, a thin insulator layer 3, such as silicon dioxide, is applied to the surface 2. Conductors 4, which may be gate regions or bit lines, are typically metal, such as aluminum, or polysilicon, with or without doping. The conductors 4 would typically be applied as a uniform layer. The layer would then typically be masked and etched to form patterned leads, pads, or interconnects, e.g., as required by the circuit. The mask layer would then be removed. A thicker insulating layer 5, for example silicon dioxide, would then be applied over the conductors 4, resulting in a nonplanar surface 6. This nonplanar surface 6 will, in successive processing, cause compounding of step problems resulting from the increasingly nonplanar surface which will result. Therefore, as previously stated, it is desirable to planarize the surface 6 at this point. It is pointed out, however, that these materials and layer arrangements are only exemplary. For instance, a nonplanar metal layer could be formed over a layer of insulator strips and planarized down to the insulator level.

Figure 2:
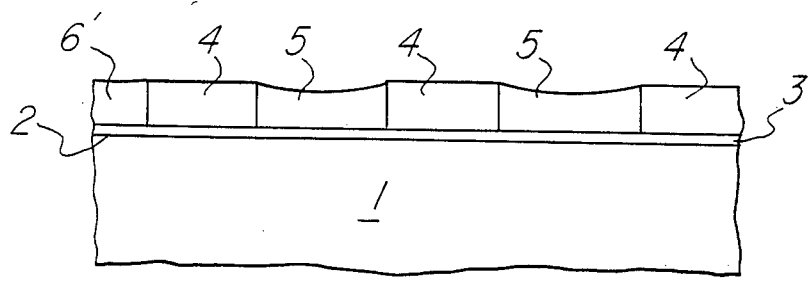
FIG. 2 is a cross sectional representation of the simplified device of FIG. 1 after mechanical planarization.

FIG. 2 illustrates the results of a mechanical planarizing process employed on the exemplary wafer of FIG. 1. The reference numerals of FIG. 1 are carried forward to FIG. 2. It is seen from FIG. 2 that the process results in an essentially planar top surface 6'. It has been discovered further that mechanical planarizing methods are or can be somewhat selective as found in some etch processes. This selectivity is dependent upon the hardness of the materials planarized. It is pointed out in the example of FIG. 2, that the surface 6' is slightly indented or irregular in the insulating regions. It has been discovered that a mechanical planarizing process can be effectively and expediently controlled. The planarizing selectivity of materials may be advantageously used to effectively stop or slow down the removal of material at a desired point. Due to the relative uniformity of material removal per period of time which can be achieved, control of the process by timing is generally effective. Control of the process by various continuous measuring techniques is a practical means of control. Control of the process may also be achieved by monitoring the composition of the material removed from the wafer and stopping the process when a specific material is detected which is first located at the surface level of the wafer that is desired to be maintained.

Figure 3:
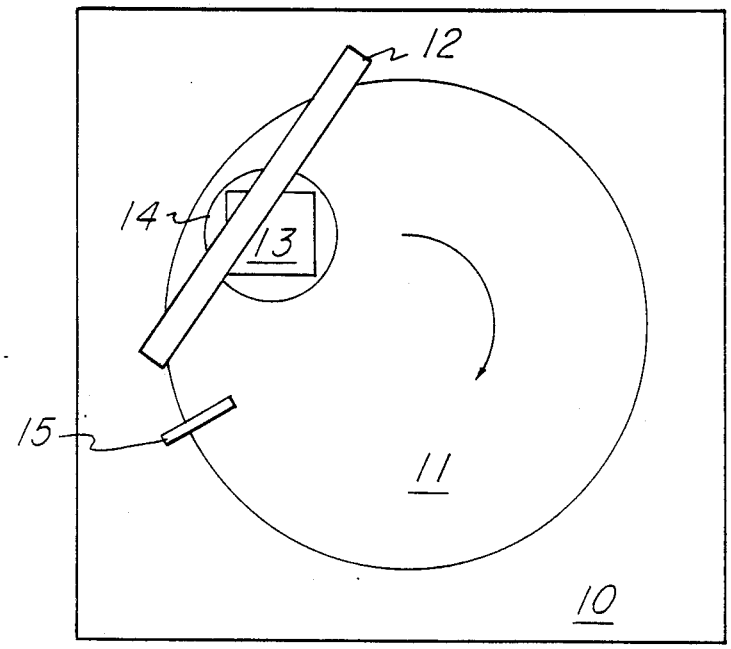
FIG. 3 is a schematic drawing of an apparatus for mechanical planarization.

FIG. 3 illustrates a typical polishing apparatus of a type known in the art which may be used for planarizing a partially processed nonplanar surface of a wafer. A base 10 has mounted a circular rotating polishing disc 11 which is typically driven by a motor (not shown). A work-holding arm 12 is detachably mounted to the base 10 at at least one point or more as shown in the figure. Arm 12 has attached a wafer chuck 13 which is designed to hold a semiconductor wafer 14 such as that partially illustrated at FIG. 1. The wafer may be attached to the chuck by any of several means such as suction, a releasable glue, a holding wax, or gripping fingers. The polishing disc may be glass having very finely divided diamond particles embedded therein or simply have a slightly roughened surface or any of several known surfaces. A tube 15 for introducing a liquid, such as deionized water to the surface for the purpose of reducing heat build up and carrying away removed material is shown.

Using this device to planarize a surface of a non-planar partially-processed wafer would proceed as follows. The wafer 14 must be mounted to the chuck 13. The chuck 13 is mounted on the holding arm 12 such that the surface of the wafer is parallel to the disc 11. The liquid is turned on and the disc 11 is caused to rotate. The wafer 14 is forced against the disc by a relatively constant force, in this case the weight of the arm apparatus. The wafer must be monitored continuously or at frequent intervals to determine when the desire level of planarizing is reached at which time the wafer is withdrawn from the disc. Such monitoring may be visual, by mechanical or electrical thickness measuring devices, by timing, or by optical devices.

The inventive process is intended to encompass by the claims following various modifications and embodiments such as the following examples: the wafer may be at various phases of processing subsequent to polishing of the "blank" stock wafer which phases result in a nonplanar surface; the wafer may be mechanically planarized more than one time at separate stages of processing; various mechanical devices may be employed such as abrasive discs, abrasive styli, and slurry compounds; the wafer may be moved relative to the abrasive device or vice versa; various measuring techniques may be employed to determine the end point of the process.

I claim:

1. A process for producing a substantially planar surface on a semiconductor wafer after said wafer has been polished and subsequent processing has been accomplished which results in a nonplanar surface, comprising the steps of:
    contacting said nonplanar surface of said wafer to an abrasive by a substantially constant pressure;
    moving said wafer and said abrasive relative to each other for a time period while maintaining said substantially constant pressure to cause mechanical removal of material from said wafer;
    monitoring the composition of said removed material, and;

releasing said wafer and said abrasive from contact when a predetermined composition is detected.

2. The process of claim 1 wherein said abrasive means is an abrasive disc.

3. The process of claim 2 wherein said abrasive disc is substantially glass.

4. The process of claim 1 wherein said abrasive is a pointed stylus.

5. The process of claim 4 wherein said pointed stylus is a diamond-tipped stylus.

6. The process of claim 1 wherein said wafer includes at least one conductive layer and at least one insulator layer.

7. The process of claim 6 wherein said conductive layer is substantially metal.

* * * * *